US008315403B2

(12) United States Patent
Konagai et al.

(10) Patent No.: US 8,315,403 B2
(45) Date of Patent: Nov. 20, 2012

(54) METHOD FOR CONTROLLING DIRECTIVITY OF LOUDSPEAKER APPARATUS AND AUDIO REPRODUCTION APPARATUS

(75) Inventors: Yusuke Konagai, Hamamatsu (JP); Susumu Takumai, Hamamatsu (JP)

(73) Assignee: Yamaha Corporation (JP)

( * ) Notice: Subject to any disclaimer, the term of this patent is extended or adjusted under 35 U.S.C. 154(b) by 1609 days.

(21) Appl. No.: 11/571,741

(22) PCT Filed: Jul. 6, 2005

(86) PCT No.: PCT/JP2005/012495
§ 371 (c)(1), (2), (4) Date: Mar. 9, 2007

(87) PCT Pub. No.: WO2006/004159
PCT Pub. Date: Jan. 12, 2006

(65) Prior Publication Data
US 2007/0230724 A1 Oct. 4, 2007

(30) Foreign Application Priority Data
Jul. 7, 2004 (JP) ................................ 2004-201064

(51) Int. Cl.
*H03G 3/00* (2006.01)
*H04R 5/00* (2006.01)
*H04R 5/02* (2006.01)

(52) U.S. Cl. ............................ 381/63; 381/307; 381/27

(58) Field of Classification Search .................... 381/61, 381/63, 17–19, 99, 27, 307, 310
See application file for complete search history.

(56) References Cited

U.S. PATENT DOCUMENTS 4,133,975 A * 1/1979 Barker, III .................... 381/303
4,256,922 A 3/1981 Gorike
4,882,753 A * 11/1989 Shivers ......................... 381/307
4,888,804 A * 12/1989 Gefvert ......................... 381/304
5,109,416 A * 4/1992 Croft ............................. 381/304
(Continued)

FOREIGN PATENT DOCUMENTS

GB 2 016 863 A 9/1979
(Continued)

OTHER PUBLICATIONS

Office Action for JP-2004-201064 dated Aug. 5, 2009 (English Translation Provided).

(Continued)

*Primary Examiner* — Xu Mei
(74) *Attorney, Agent, or Firm* — Rossi, Kimms & McDowell LLP

(57) ABSTRACT

To provide an audio reproduction apparatus in which a general user inputs simple and easy settings so that audio beams of respective channels can be set. When an array speaker is installed in a room, the user inputs the shape of the room into the audio reproduction apparatus. Based on the shape of the room, the audio reproduction apparatus determines a beam control pattern indicating which directions audio signals of the channels should be formed respectively. The audio reproduction apparatus reads beam control data including delay times for forming the beams in the directions from a pattern memory, and automatically sets the beam control data in a DSP. Thus, only when the user inputs the shape of the room, the beams are controlled with a beam control pattern suitable to the room so that multi-channel audio can be reproduced optimally.

5 Claims, 8 Drawing Sheets

U.S. PATENT DOCUMENTS

| | | | | | |
|---|---|---|---|---|---|
| 5,533,129 | A * | 7/1996 | Gefvert | 381/300 |
| 5,809,150 | A * | 9/1998 | Eberbach | 381/300 |
| 5,953,432 | A * | 9/1999 | Yanagawa et al. | 381/335 |
| 5,974,154 | A | 10/1999 | Nagata et al. | |
| 6,128,395 | A * | 10/2000 | De Vries | 381/387 |
| 6,169,806 | B1 * | 1/2001 | Kimura et al. | 381/17 |
| 7,092,541 | B1 * | 8/2006 | Eberbach | 381/300 |
| 7,362,874 | B2 * | 4/2008 | Lee et al. | 381/307 |
| 7,391,869 | B2 * | 6/2008 | Eid et al. | 381/22 |
| 7,515,719 | B2 | 4/2009 | Hooley et al. | |
| 7,580,530 | B2 * | 8/2009 | Konagai et al. | 381/61 |
| 2004/0151325 | A1 | 8/2004 | Hooley et al. | |

FOREIGN PATENT DOCUMENTS

| | | | |
|---|---|---|---|
| JP | 05-191898 | A | 7/1993 |
| JP | 5165443 | A | 7/1993 |
| JP | 06-205496 | A | 7/1994 |
| JP | 06205496 | A | 7/1994 |
| JP | 8030286 | A | 2/1996 |
| JP | 11215586 | A | 8/1999 |
| JP | 2003-510924 | A | 3/2003 |
| JP | 2003-299180 | A | 10/2003 |
| JP | 2004-179711 | A | 6/2004 |
| JP | 2005-64746 | A | 3/2005 |
| WO | 01/23104 | A2 | 4/2001 |
| WO | 02/078388 | A2 | 10/2002 |

OTHER PUBLICATIONS

Notification of Reasons for Refusal issued on May 19, 2009 in the corresponding Japanese Patent Application No. 2004-201064.

Relevant portion of International Search Report of corresponding PCT Application PCT/JP2005/012495 (partial translation).

Extended European Search Report issued in corresponding European Patent Application No. 05758358311.4 dated Feb. 15, 2010.

* cited by examiner

FIG. 6

| PATTERN NO. | |
|---|---|
| 1-1 | BEAM CONTROL DATA 1-1 |
| 1-2 | BEAM CONTROL DATA 1-2 |
| 1-3 | BEAM CONTROL DATA 1-3 |
| ⋮ | ⋮ |
| 2-1 | BEAM CONTROL DATA 2-1 |
| 2-2 | BEAM CONTROL DATA 2-2 |
| 2-3 | BEAM CONTROL DATA 2-3 |
| ⋮ | ⋮ |
| 3-1 | BEAM CONTROL DATA 3-1 |
| ⋮ | ⋮ |
| 4-1 | BEAM CONTROL DATA 4-1 |
| ⋮ | ⋮ |
| 5-1 | BEAM CONTROL DATA 5-1 |
| ⋮ | ⋮ |
| 6-1 | BEAM CONTROL DATA 6-1 |
| ⋮ | ⋮ |

METHOD FOR CONTROLLING DIRECTIVITY OF LOUDSPEAKER APPARATUS AND AUDIO REPRODUCTION APPARATUS

CROSS-REFERENCE TO RELATED APPLICATION

This application is based a U.S. National Phase Application of PCT International Application PCT/JP2005/012495 filed on Jul. 6, 2005.

TECHNICAL FIELD

The present invention relates to an audio reproduction apparatus for reproducing a multi-channel audio signal by use of an array speaker, and a method for controlling the directivity of the audio reproduction apparatus.

BACKGROUND ART

There has been hitherto proposed an apparatus for reproducing a multi-channel audio signal by use of an array speaker where a plurality of speaker units are disposed in a matrix. That is, one and the same audio signal is input into the respective speaker units simultaneously or with timing varied little by little, so that this audio signal can be output like beams based on the principle of superposition. As shown in FIG. 3, when an audio signal is input to each speaker unit with timing shifted little by little, beams are formed obliquely. When the lag time (delay time) of this timing is set properly, audio beams can be formed in desired directions.

When the delay times of audio signals of respective channels of a multi-channel audio signal are set properly by use of this characteristic of the array speaker and input to the array speaker, the audio signals of the respective channels are output as beams having different directions respectively, for example, as shown in FIG. 1(A).

In the example of FIG. 1(A), an audio signal of a center channel C (referred to as center channel C; the same thing will be applied to the following cases) is output directly toward a listener in the front, while a front left channel FL and a front right channel FR are reflected once by side walls respectively and then arrive at the listener, and a surround left channel SL and a surround right channel SR are reflected twice by the side walls and a rear wall respectively and then arrive at the listener. The listener can listen to the audio signals of the respective channels as if they came from different directions respectively. Thus, multi-channel audio reproduction can be attained artificially.

Patent Document 1: JP-T-2003-510924

DISCLOSURE OF THE INVENTION

The shape of a room in FIG. 1(A) has an ideal shape. The room where the audio system is installed does not always have such a shape. That is, the audio system may be installed in a room having a shape as shown in FIG. 1(B)-(F). In this case, the system for forming beam paths of the respective channels or virtual audio images of the respective channels may differ from that of FIG. 1(A).

In the aforementioned audio system, however, a general user who purchased the audio system has difficulty in setting the beam directions of the audio signals of the respective channels in accordance with the shape of the room by himself/herself.

An object of this invention is to provide an audio reproduction apparatus and a method for controlling directivity of a loudspeaker apparatus in which a general user can input easy and simple settings so as to set audio beams of respective channels.

A method for controlling directivity of a loudspeaker apparatus according to this invention includes the steps of: installing the loudspeaker apparatus on a front side of a room having first and second side walls, the loudspeaker apparatus having an array speaker including a plurality of speaker units, the loudspeaker apparatus being capable of outputting a plurality of audio signals having directivities independent of one another; outputting an audio signal of a center channel toward a listening position; outputting an audio signal of a first front left channel toward the listening position; outputting an audio signal of a second front left channel while controlling directivity thereof so that the audio signal reflected by the first side wall reaches the listening position; outputting an audio signal of a first front right channel toward the listening position; outputting an audio signal of a second front right channel while controlling directivity thereof so that the audio signal reflected by the second side wall reaches the listening position; outputting an audio signal of a surround left channel while controlling directivity thereof so that the audio signal reflected by the first side wall reaches the listening position; and outputting an audio signal of a surround right channel while controlling directivity thereof so that the audio signal reflected by the second side wall reaches the listening position.

A method for controlling directivity of a loudspeaker apparatus according to this invention includes the steps of: installing the loudspeaker apparatus on a front side of a room having first and second side walls, the loudspeaker apparatus having an array speaker including a plurality of speaker units, the loudspeaker apparatus being capable of outputting a plurality of audio signals having directivities independent of one another; outputting a high-frequency component of an audio signal of a center channel from speaker units in a center portion of the array speaker; outputting a high-frequency component of an audio signal of a front left channel from speaker units in a left portion of the array speaker; outputting a high-frequency component of an audio signal of a front right channel from speaker units in a right portion of the array speaker; outputting an audio signal of a surround left channel while controlling directivity thereof so that the audio signal reflected by the first side wall reaches the listening position; and outputting an audio signal of a surround right channel while controlling directivity thereof so that the audio signal reflected by the second side wall reaches the listening position.

A method for controlling directivity of a loudspeaker apparatus according to this invention includes the steps of: installing the loudspeaker apparatus in a room having first and second walls, so as to locate the loudspeaker apparatus opposite to the second wall, the loudspeaker apparatus having an array speaker including a plurality of speaker units, the loudspeaker apparatus being capable of outputting a plurality of audio signals having directivities independent of one another; outputting a high-frequency component of an audio signal of a center channel from a center portion of the array speaker; outputting a high-frequency component of an audio signal of a front left channel from a left portion of the array speaker; outputting a high-frequency component of an audio signal of a front right channel from a right portion of the array speaker; outputting an audio signal of a first surround channel while controlling directivity thereof so that the audio signal reflected by the first and second walls reaches the listening position; outputting an audio signal of a second surround channel from a side portion of the array speaker farther from the first wall; and outputting an audio signal of a third surround channel while controlling directivity thereof so that the audio signal reflected by the first and second walls reaches the listening position.

A method for controlling directivity of a loudspeaker apparatus according to this invention includes the steps of: installing the loudspeaker apparatus in a room having a first wall and a second wall arranged at a predetermined angle with the first wall, so as to locate the loudspeaker apparatus opposite to a corner portion formed by the first wall and the second wall, the loudspeaker apparatus having an array speaker including a plurality of speaker units, the loudspeaker apparatus being capable of outputting a plurality of audio signals having directivities independent of one another; outputting a high-frequency component of an audio signal of a center channel from a center portion of the array speaker; outputting a high-frequency component of an audio signal of a front left channel from a left portion of the array speaker; outputting a high-frequency component of an audio signal of a front right channel from a right portion of the array speaker; outputting an audio signal of a surround left channel while controlling directivity thereof so that the audio signal reflected by the first wall reaches the listening position; and outputting an audio signal of a surround right channel while controlling directivity thereof so that the audio signal reflected by the second wall reaches the listening position.

A method for controlling directivity of a loudspeaker apparatus according to this invention includes the steps of: installing the loudspeaker apparatus in a room having first and second side walls and a third wall disposed between the first and second side walls, so as to locate the loudspeaker apparatus opposite to the third wall, the loudspeaker apparatus having an array speaker including a plurality of speaker units, the loudspeaker apparatus being capable of outputting a plurality of audio signals having directivities independent of one another; outputting an audio signal of a first front left channel toward the listening position while controlling directivity thereof; outputting an audio signal of a second front left channel while controlling directivity thereof so that the audio signal reflected by the first side wall reaches the listening position; outputting an audio signal of a first front right channel toward the listening position while controlling directivity thereof; outputting an audio signal of a second front right channel while controlling directivity thereof so that the audio signal reflected by the second side wall reaches the listening position; and adjusting ratios between outputs of the audio signal of the first front left channel and the audio signal of the first front right channel and outputs of the audio signal of the second front left channel and the audio signal of the second front right channel respectively so as to improve acoustic balance between left and right.

In the aforementioned configurations of this invention, it will go well if there are wall surfaces in specified directions. A wall surface may be present or absent in any direction other than the specified directions.

An audio reproduction apparatus according to this invention includes: an array speaker having a plurality of speaker units; a signal processing portion having processing circuits for the speaker units respectively and for controlling timings with which respective channels of a multi-channel audio signal are output to the array speaker, the signal processing portion controlling the array speaker based on timing control data set in the processing circuits so as to output audio signals of the channels as beams in desired directions respectively; an input portion for inputting a shape of the room; and a setting portion for determining directions in which the audio signals of the channels are formed into beams in accordance with the input shape of the room, and setting timing control data in the speaker units of the channels respectively, the timing control data serving to form the beams in the determined directions.

In the audio reproduction apparatus according to the invention, an outline shape and dimensions of the room are input to the input portion; and based on the input outline shape and dimensions, the setting portion determines directions in which the audio signals of the channels are formed into beams respectively, while the setting portion has a storage portion storing timing control data for forming beams in a plurality of directions, and when the directions in which the audio signals of the channels are formed into beams are determined, the setting portion reads timing control data corresponding to the determined directions from the storage portion, and sets the timing control data in the speaker units of the channels respectively.

According to the present invention, the beam direction (beam control pattern) of each channel suitable to a room is decided based on the shape of the room, and timing control data are set in a signal processing portion so that a beam is formed in the direction. It will therefore go well only if a user inputs the shape of the room. It is possible to reproduce multi-channel audio with an array speaker without any troublesome setting operation.

BRIEF DESCRIPTION OF THE DRAWINGS

FIG. 6 A table showing an example of a configuration of a pattern memory of the same audio system.

Figure 1:
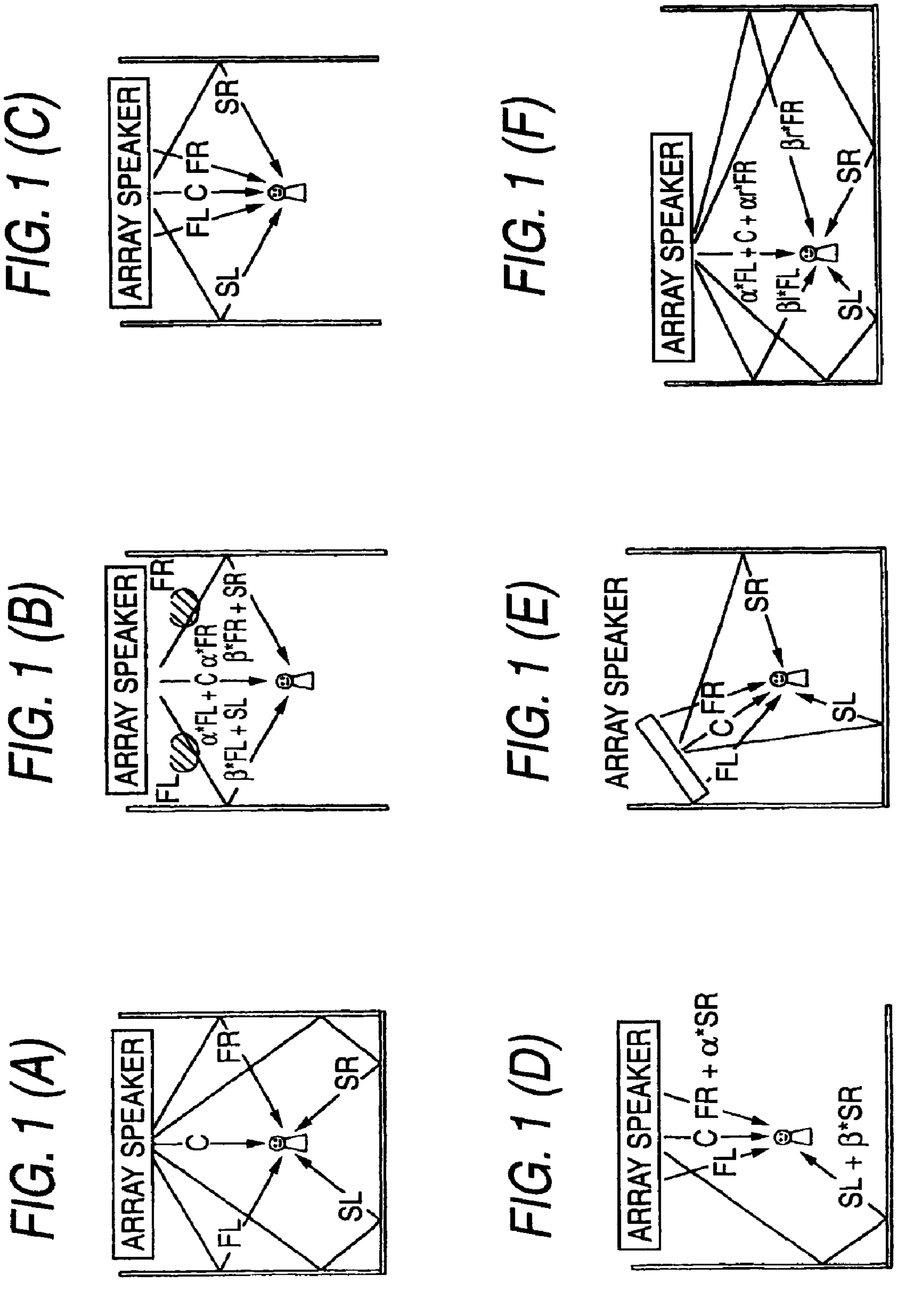
FIG. 1 Diagrams showing examples of beam control patterns corresponding to outline shapes of rooms where an audio system according to an embodiment of this invention is installed.

The reference numerals in the drawings: 1 . . . array speaker, 2 . . . circuit portion, 10 . . . control portion, 11 . . . pattern memory, 14 . . . signal processing portion, 20 . . . filter portion, 21 . . . multiplexer portion, 22 . . . adjustment portion, 23 . . . beam control portion, and 24 . . . adder.

BEST MODE FOR CARRYING OUT THE INVENTION

A multi-channel audio system according to an embodiment of the present invention will be described with reference to the drawings. This audio system is a system for artificially attaining multi-channel audio reproduction of five channels by use of one array speaker without installing five speaker systems.

Figure 2:
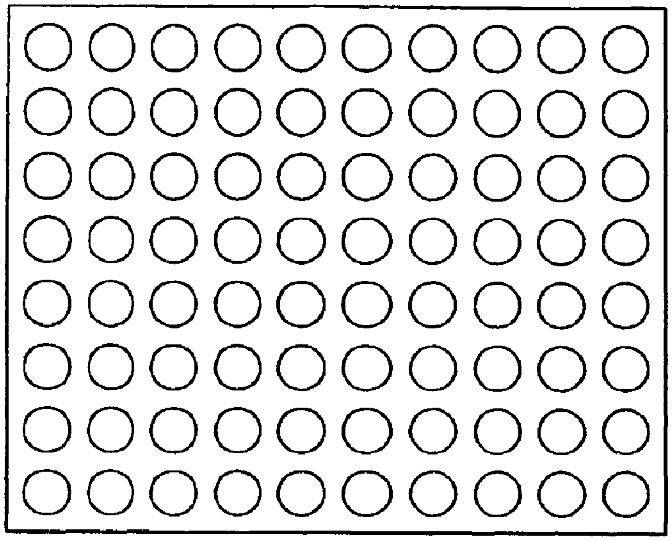
FIG. 2 Diagrams showing modes of array speakers for use in the same audio system.
Figure 2:
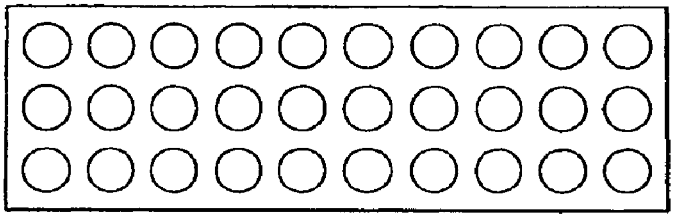
Figure 2:
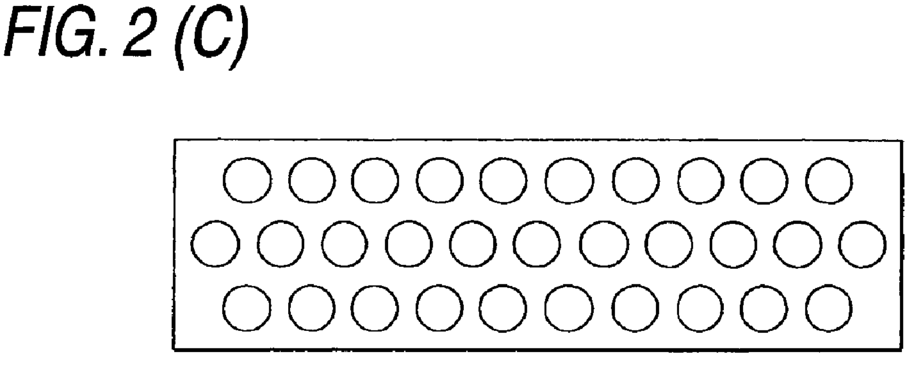

In the array speaker, a plurality of speaker units are disposed in lines or in a matrix as shown in FIGS. 2(A)-(C) by way of example. In this embodiment, assume that an array speaker having three-line arrays as shown in FIG. 2(C) is used.

Figure 3:
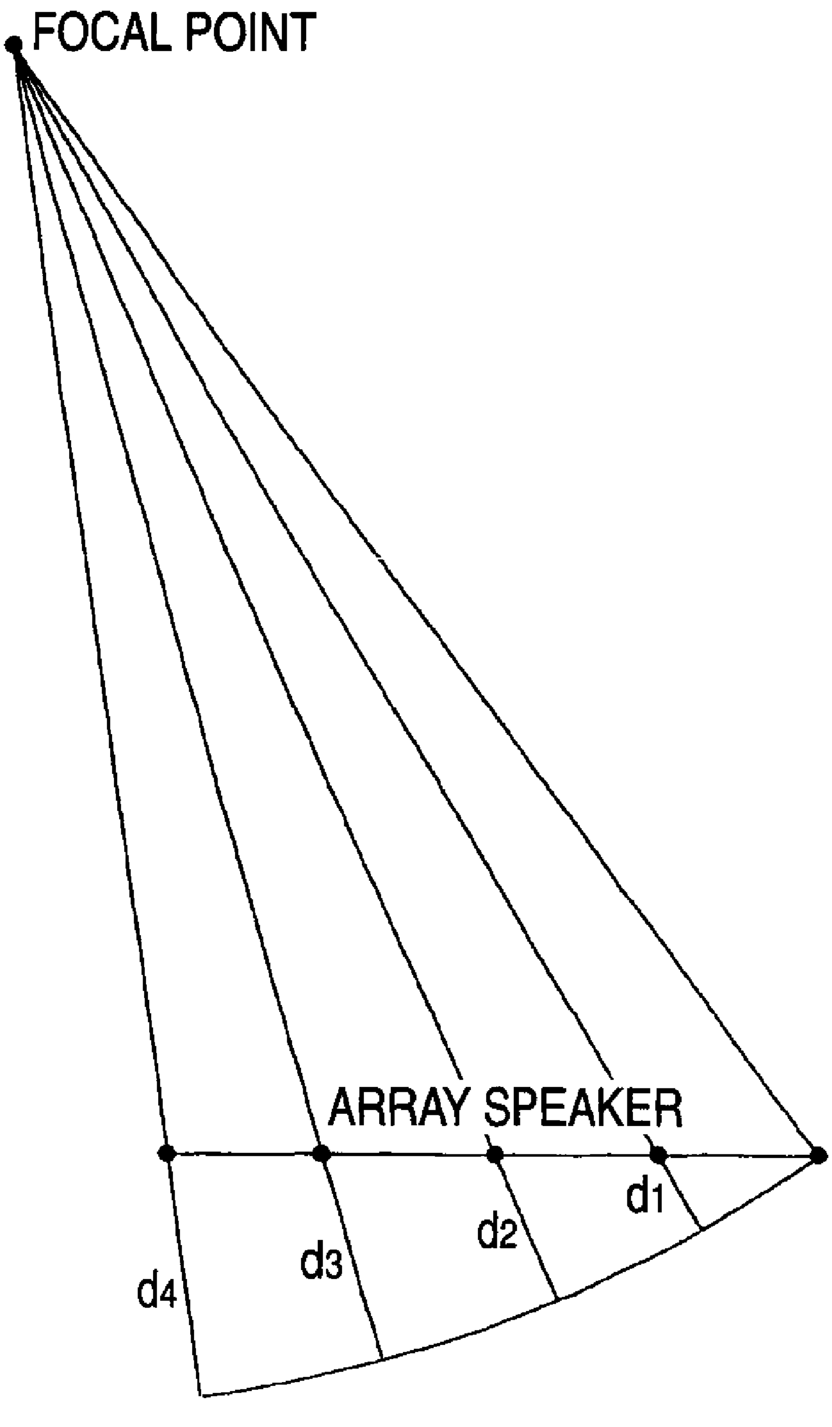
FIG. 3 A diagram for explaining the relationship between a focal point of beams formed by the same array speaker and delay times.

As shown in FIG. 3, one and the same audio signal is output from each speaker unit, and the output timing of each speaker unit is adjusted so that the time when the output audio signal will reach a predetermined point (focal point) in a space coincides with that of another. Thus, the audio signal like a beam with directivity to the focal point can be output by the principle of superposition.

The timings of audio signals of respective channels of a multi-channel audio signal are controlled by use of this characteristic of the array speaker so as to form beams in different directions respectively. The timings are then superposed and input to the array speaker. Thus, the audio signals of the respective channels are formed into beams and propagated in different directions respectively, for example, as shown in FIG. 1(A), without overlapping one another.

The example of FIG. 1(A) is an example in which a room having a rectangular shape, which is a basic shape for multi-channel reproduction using an array speaker and close to a square, is used with the shorter wall as the front wall, and the array speaker is placed at the center of the wall side. In this room shape, the audio signals of the respective channels are output as follows. The center channel C (the audio signal thereof; the same thing will be applied to the following cases) is output directly to the listener in front thereof. The front left channel FL and the front right channel FR are formed into beams which will be reflected once by the side walls respectively before arriving at the listener. The surround left channel SL and the surround right channel SR are formed into beams which will be reflected twice by the side walls and the rear wall respectively before arriving at the listener. As a result, the listener listens to the audio signals as if the center channel C came from the front side, the front left channel FL and the front right channel FR came diagonally from the left and right front sides respectively, and the surround left channel SL and the surround right channel SR came diagonally from the left and right rear sides respectively. Thus, multi-channel audio reproduction is attained artificially.

The room shape of FIG. 1(A) is an ideal shape. When the audio system is installed in a room having another outline shape, the beams are controlled with a pattern corresponding to the room shape.

Here, beam control patterns corresponding to various room shapes will be described with reference to FIG. 1.

First, FIG. 1(A) shows a beam control pattern when the array speaker 1 is installed at the center of the front surface of a room having an ideal (rectangular) shape as described above.

FIG. 1(B) is a diagram for explaining a beam control pattern when the array speaker 1 is installed in a room having no wall surface in the rear wall (including the case where the rear wall is distant or the case where the wall surface of the rear wall is made of a material absorbing sound).

As for the center channel C, a beam is formed toward the front side so as to make the sound reach the listener directly, in the same manner as in the aforementioned case of FIG. 1(A). The audio beams of the surround channels SL and SR are designed to be reflected once by the left and right wall surfaces respectively before arriving at the listener in place of the front channels in FIG. 1(A). This is because the audio beams cannot be reflected by the wall surface of the rear wall as in the case of FIG. 1(A). As for the front channels FL and FR, phantoms are formed near the array speaker 1 so as to form virtual sound sources.

Here, the phantom means a virtual sound source using the acoustic characteristic in which when one and the same audio signal comes from a plurality of directions, the listener feels a virtual sound image in a predetermined direction (direction internally divided in accordance with the power of the signal) lying midway among the plurality of directions.

The front left channel FL is output toward the front side with the power multiplied by a coefficient $\alpha$ together with the center channel C, and output toward the left wall surface with the power multiplied by a coefficient $\beta$ together with the surround left channel SL. As a result, the audio signals of the front left channel FL reach the listener from two directions, that is, from the front side and the slightly front left side respectively. The listener does not recognizes these audio signals individually, but a phantom is formed in a position internally divided in accordance with the power ratio between $\alpha$ and $\beta$. Thus, a virtual sound source of the front left channel FL can be generated on the left side of the center channel C and in front of the surround left channel SL.

The same thing can be applied to the front right channel FR.

When $\alpha=0$ and $\beta=1$ in the aforementioned system, the path (localization) of the front channel coincides with that of the rear (surround) channel. Some contents have few rear channels. In this case, the sense of localization and the sense of expansion in the front left and right are felt easily. It is effective to perform control of localization in the ratios of $\alpha=0$ and $\beta=1$.

FIG. 1(C) also shows a beam control pattern when there is no wall surface on the rear wall side, in the same manner as FIG. 1(B). In this beam control pattern, the array speaker 1 is used to be divided into three blocks, that is, center, left and right blocks, so that it is operated as if it were a 3-channel stereo speaker system. Audio signals of the center channel C, the front left channel FL and the front right channel FR are output from the divided blocks respectively.

Figure 4:
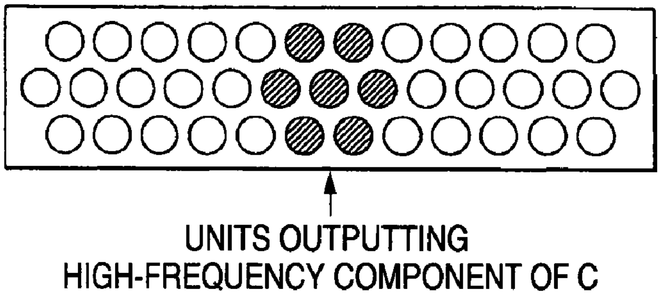
FIG. 4 Diagrams showing a division example of speaker units when the array speaker is used as a 3-channel stereo unit.
Figure 4:
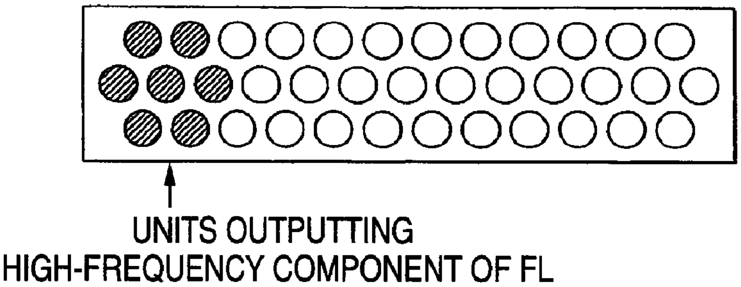
Figure 4:
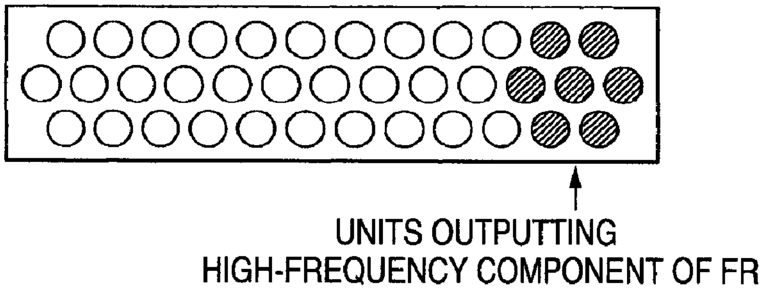
Figure 4:
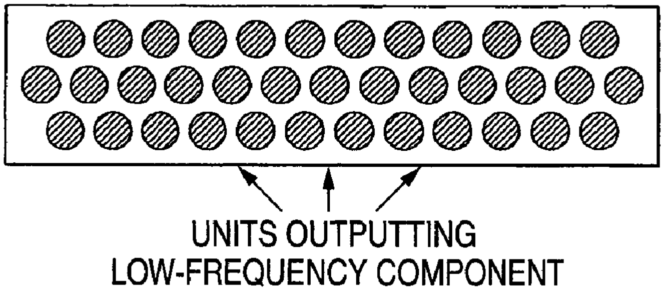

FIG. 4 show examples of divisions of the array speaker 1 in this case. Of the audio signals, low-frequency signals rarely contribute to formation of the listener's sense of localization, but the sound pressure of the low-frequency signals is required for emphasizing the low-frequency sound. Accordingly, in these examples, the low frequencies of all the channels of the center channel C, the front left channel FL and the front right channel FR are output from all the speaker units together as in FIG. 1(D). As for high-frequency audio signals, the center channel C is output from the speaker units in the center block, the front left channel FL is output from the speaker units in the left end block, and the front right channel FR is output from the speaker units in the right end block, as shown in FIGS. 1(A)-(C).

As for the center channel C and the front left and right channels FL and FR, in FIG. 1(C), the array speaker 1 is divided for stereophonic output as described above. As for the surround left and right channels SL and SR, beams are formed on the left and right sides so as to be reflected once by the left and right wall surfaces respectively and then reach the listener in the same manner as in FIG. 1(B).

FIG. 1(D) is a diagram for explaining a beam control pattern when the array speaker 1 is installed in a room having one side wall (including the case where the other side wall is distant or the case where the wall surface is made of a material absorbing sound). This example shows an example where there is no right side wall. In this case, a beam which will be reflected once by the left side wall as shown in FIG. 1(A) can be formed as the front left channel FL, but reflection by the right side wall cannot be used for the right channel. Therefore, in order to keep the balance between the left and the right, the array speaker 1 is divided for the two channels in the same manner as in FIG. 1(C), so that sounds are output directly to the listener in both the channels.

On the other hand, it is not necessary to take the balance between the left and the right into consideration for the surround channels as compared with the front channels. Therefore, a beam which will be reflected twice by the left side wall and the rear wall and then reach the listener in the same manner as in FIG. 1(A) is formed as the surround left channel. On the other hand, the surround right channel is output as a direct sound ($\alpha$*SR) from the same speaker units as the front right channel FR, or as a sound ($\beta$*SR) reflected twice in the same beam direction as the surround left channel SL, so that the sound field balance and the sense of surround sound are made close to those in the case where there are opposite side walls.

FIG. 1(E) is a diagram for explaining a beam control pattern when the array speaker 1 is installed obliquely in a front left corner of a room having the same shape as the room in FIG. 1(A). In this case, the array speaker 1 is divided to output direct sounds as the center channel C, the front left channel FL and the front right channel FR in the same manner as in the case of FIG. 1(C). The surround left channel SL is output as a beam in a direction in which the beam will be reflected once by the rear wall and then reach the listener. The surround right channel SR is output as a beam in a direction in which the beam will be reflected once by the right side and then reach the listener. Thus, multi-channel reproduction balanced between the left and the right can be achieved. Also in the case where the speaker is installed on the opposite side (front right corner), in the same manner, the surround left channel SL is designed to be reflected once by the left side wall and the surround right channel SR is designed to be reflected once by the rear wall.

In order to improve the expansion of the front channels or the natural connection between the front channels and the rear (surround) channels in this installation method, a system in which the front channels are also output to the rear paths so as to form phantom sound sources as shown in FIG. 1(B) is effective.

FIG. 1(F) is a diagram for explaining a beam control pattern in a room which is wider between the opposite side walls. Since this room has opposite side walls and a rear wall, multi-channel audio reproduction can be achieved by beam control similar to that in FIG. 1(A). However, when the front left and right channels FL and FR are designed to be reflected once by the side walls and then reach the listener in the same manner as in the example of FIG. 1(A), the audio beams reach the listener substantially just from the sides to thereby result in unnatural audibility of the listener because the width of the room is large. In addition, when there is a large difference between the distance from the left wall and that from the right wall, the left-right balance deteriorates. Therefore, the front left and right channels FL and FR are formed into beams which will be reflected once by the aforementioned side walls respectively, while they are output with powers of $\alpha l$*FL and $\alpha r$*FR and with powers of $\beta l$*FL, $\beta r$*FR as the same front beams (direct sounds) as the center channel C, so as to form phantom sound sources between the front and side walls respectively. In this event, the coefficient ratios are set desirably for the left and the right respectively so that the phantom sound sources can be formed in well-balanced positions.

Figure 5:
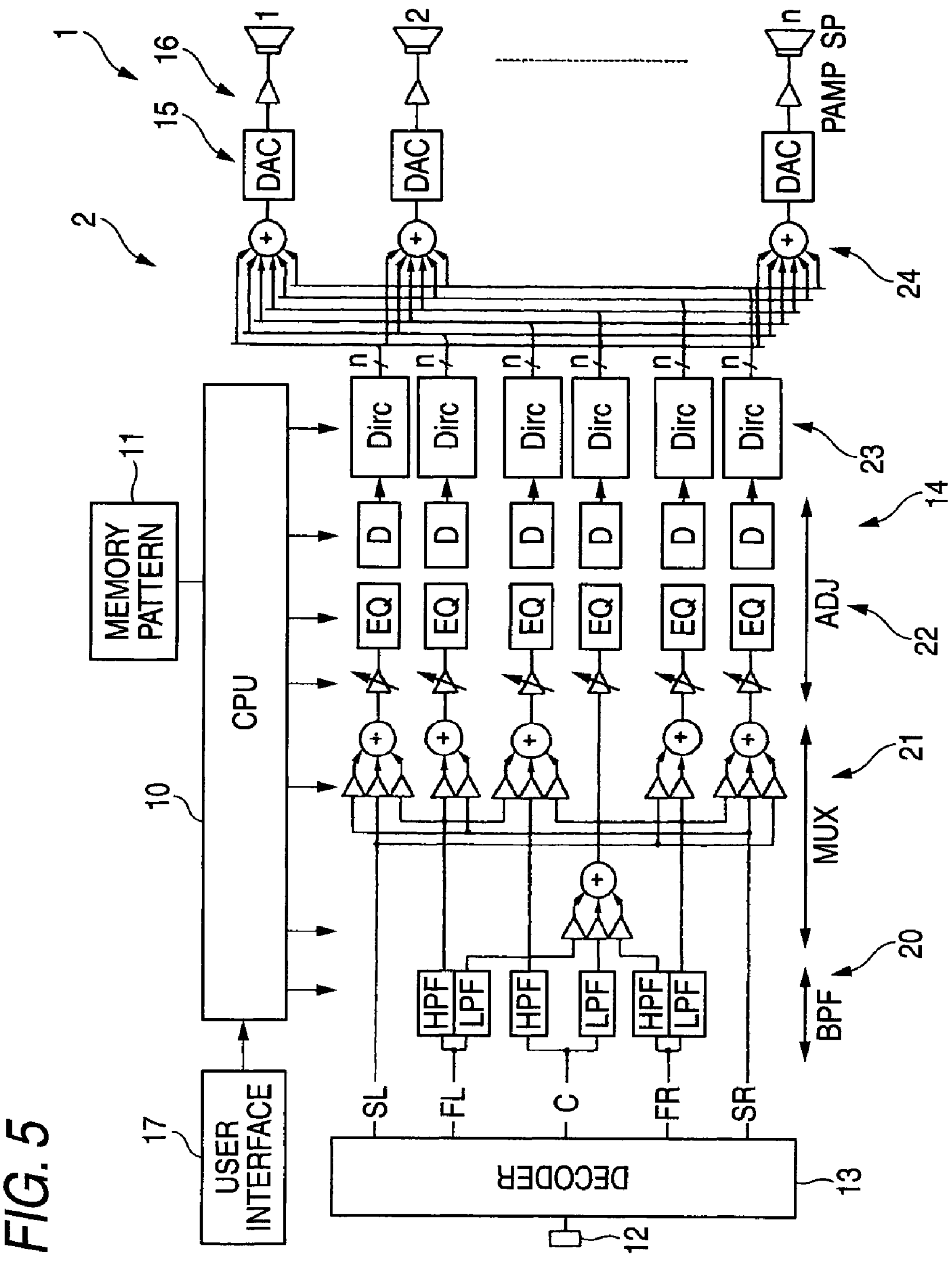
FIG. 5 A block diagram of the same audio system.

In the multi-channel audio system according to this embodiment, beam control data for obtaining the aforementioned beam control patterns corresponding to various room shapes are stored in a pattern memory in advance, and beam control data of one beam control pattern are selected based on room shape data input by the user, and set in a signal processing portion 14 (see FIG. 5). Thus, only when the user inputs the room shape, beam directions or phantoms the most suitable to the room can be set automatically all over the channels.

FIG. 5 is a block diagram of the same multi-channel audio system. This audio system is constituted by the array speaker 1 and a circuit portion 2. The circuit portion 2 may be received in a housing together with the array speaker 1 or may be formed separately from the array speaker 1.

The circuit portion 2 has a control portion 10, a pattern memory 11, a decoder 13, a signal processing portion 14, amplifiers 16 and a user interface 17.

The decoder 13 is connected to a digital audio input terminal 12 so as to decode digital audio data input from this digital audio input terminal 12 into multi-channel audio signals. In this embodiment, the digital audio data are decoded into 5-channel audio signals. The decoded 5-channel audio signals (center C, front left FL, front right FR, surround left SL and surround right SR) are input into the signal processing portion 14.

The signal processing portion 14 is constituted by a DSP, in which functional portions including filter portions (BPF) 20, multiplexer portions (MUX) 21, adjustment portions (ADJ) 22, directivity control portions (DirC) 23, and adders 24 provided correspondingly to the number of speaker units are arranged by a micro-program. Each functional portion performs various operations in accordance with settings of the control portion 10.

Each filter portion 20 is a functional portion for separating an audio signal of each channel by frequency band. In the example of FIG. 5, the center channel C, the front left FL and the front right FR are separated into high-frequency components and low-frequency components in accordance with the beam control pattern of FIG. 1(C), respectively.

Each multiplexer portion 21 is a functional portion in which components of audio signals of the respective channels (respective signals separated by frequency band) which should be output as beams in one and the same direction are multiplied by gain coefficients respectively and combined with one another. For example, in the beam control pattern of FIG. 1(C), the low-frequency components of the center channel C, the front left FL and the front right FR are combined. In the beam control pattern of FIG. 1(B), the center channel C, the front left FL*$\alpha$ and the front right FR*$\alpha$ are combined, while the front left FL*$\beta$ and the surround left SL are combined, and the front right FR*$\beta$ and the surround right SR are combined.

Each adjustment portion 22 is a functional portion in which the combined signal of each beam output from the multiplexer portion 21 is compensated as to a change in volume or quality caused by the beam path length, the number of times of reflection, etc. The adjustment portion 22 has a gain coefficient multiplier, an equalizer and a delay portion. The gain coefficient multiplier multiplies an audio signal by a gain coefficient in order to compensate attenuation caused by the distance or the number of times of reflection required for the beam to reach the listener. The equalizer adjusts the gain of each frequency band to compensate attenuation etc. in a high frequency band caused by the frequency properties of the speaker units of the array speaker 1 themselves or the reflection on the wall surfaces. The delay portion is a functional portion for providing a delay corresponding to a distance of the beam (including a direct sound) to the listener in order to compensate a difference in time of arrival at the listener caused by the difference in beam path length.

Each directivity control portion 23 is a functional portion for controlling timing to output an audio signal to each speaker unit in order to output the audio signal as a beam directed to a predetermined focal point. This functional portion is attained, for example, by providing a shift register with an output tap for each speaker unit. Directivity is controlled for each of the audio signals output from each multiplexer portion 21. Therefore, the directivity control portions are provided correspondingly to the number of audio signals.

Audio signals for each speaker unit output from the directivity control portions provided for the audio signals respectively are combined by each adder 24 for each speaker unit. The combined signal is converted into an analog signal by a D/A converter 15 and then input to the corresponding power amplifier 16. The power amplifier 16 amplifies this audio signal and inputs the audio signal into the corresponding speaker unit of the array speaker 1. The speaker unit radiates this audio signal as aerial vibration.

The control portion 10 controls the signal processing portion 14 configured thus. The control portion 10 reads the beam control data stored in the pattern memory 11, sets the filter portions 20, the multiplexer portions 21, the adjustment portions 22 and the directivity control portions 23 in a predetermined configuration based on the beam control data, sets predetermined parameters in the gain coefficient multipliers of the multiplexer portions 21 and the gain coefficient multipliers, the equalizers and the delay portions of the adjustment portions 22, and sets output taps in the directivity control portions 23 in accordance with the beam directions and the focal lengths.

FIG. 6 is a diagram showing an example of stored contents in the pattern memory 11. Beam control data for obtaining beam control patterns (Patterns 1-6) corresponding to the outline shapes of the rooms shown in FIGS. 1(A)-(F) are stored in the pattern memory. As described above, the beam control data consist of a beam pattern for setting the configuration of the filter portions (BPF) 20 and the multiplexer portions (MUX) 21, tap data for controlling the directivity control portions (DirC) 23 so as to set the beam directions and the focal lengths, delay data for setting alignment for each beam, a gain correction value G for compensating a gain difference among the beams, and equalizing data for compensating a difference in sound quality among the beams.

The most suitable values of these data vary in accordance with the size of the room etc. as well as the outline shape of the room. Therefore, a plurality of pieces of beam control data (for example, patterns 1-1, 1-2, . . . ) corresponding to different sizes of rooms are stored for each beam control pattern. That is, the conditions to decide the beam directions or the focal point, such as the distance between the array speaker 1 and the listener, differ in accordance with the size of the room. It is therefore necessary to set the position of the focal point also in consideration of the size of the room and decide the beam control data corresponding thereto. To this end, according to this embodiment, a plurality of kinds of beam control data corresponding to sizes of rooms are stored for each beam control pattern.

The beam control data may be selected by a pattern number input directly by the user (listener). Alternatively, the user may input the shape of the room to select the beam control pattern corresponding to the room shape.

Figure 7:
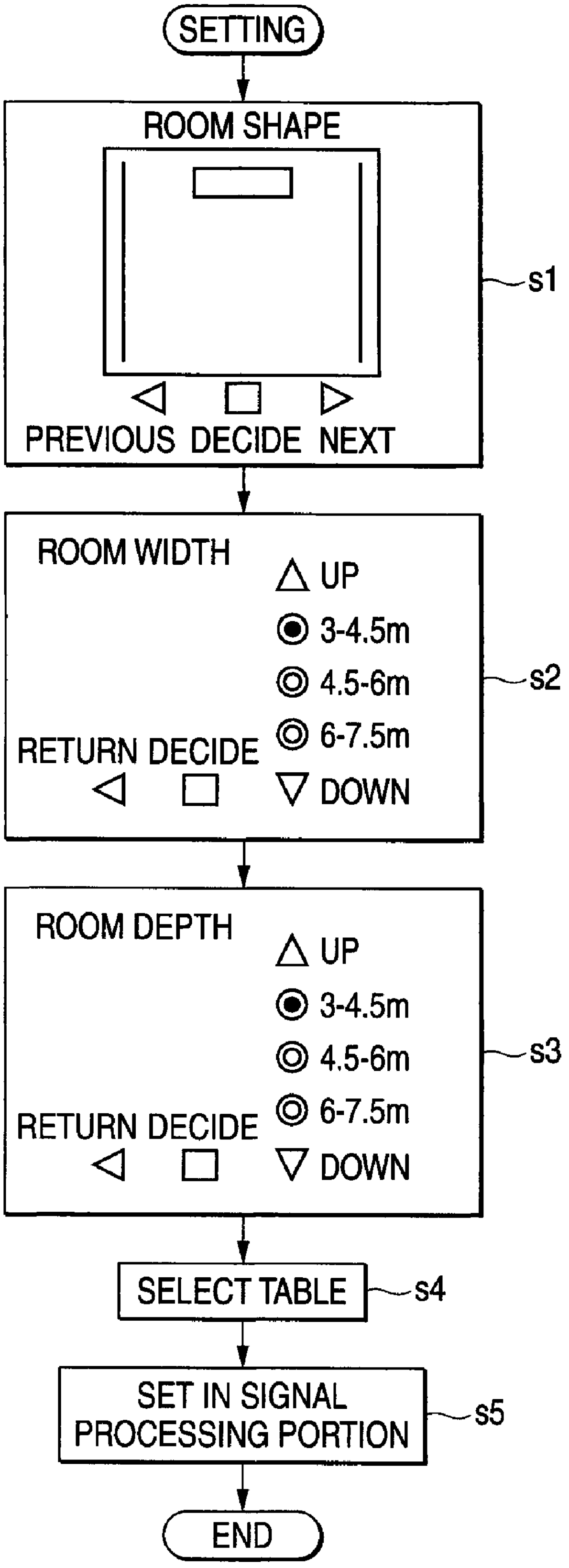
FIG. 7 A flow chart showing an operation when a control portion reads beam control data from a pattern memory and sets the beam control data in a signal processing portion.

FIG. 7 is a flow chart showing the operation of the control portion of the same audio system. This operation shows a beam control pattern setting operation. This beam control pattern setting operation may be performed once when the array speaker 1 is installed in the room. This processing operation is performed as soon as a beam control pattern setting mode is set by the user's operation.

First, a plurality of room outline shapes shown in FIGS. 1(A)-(F) are displayed on a display to urge the user to select one (s1). Next, the user is urged to select a room width from three options (s2). The three options are displayed on the display so that one of them can be selected by up/down cursor keys. The size selected when an enter key is turned on is imported.

Next, the user is urged to select a room depth from three options (s3). When the aforementioned selections have been performed, the control portion 10 reads beam control data corresponding to the selected contents from the pattern memory 11 (s4), and sets the beam control data in the signal processing portion 14 which is a DSP (s5). Thus, beam control for a pattern can be performed in accordance with the outline shape and dimensions of the room selected by the aforementioned operation.

In the aforementioned manner, according to this embodiment, one is selected from a plurality of room shape models so as to specify the outline shape of a room, and the width and depth of the room is input to specify the dimensions of the room. However, the system for specifying the room shape is not limited to this embodiment. In addition, according to this embodiment, beam control data corresponding to the modeled room shapes are stored in the pattern memory 11 in advance. However, beam control data may be operated based on information of a room shape as soon as the information is input.

Figure 8:
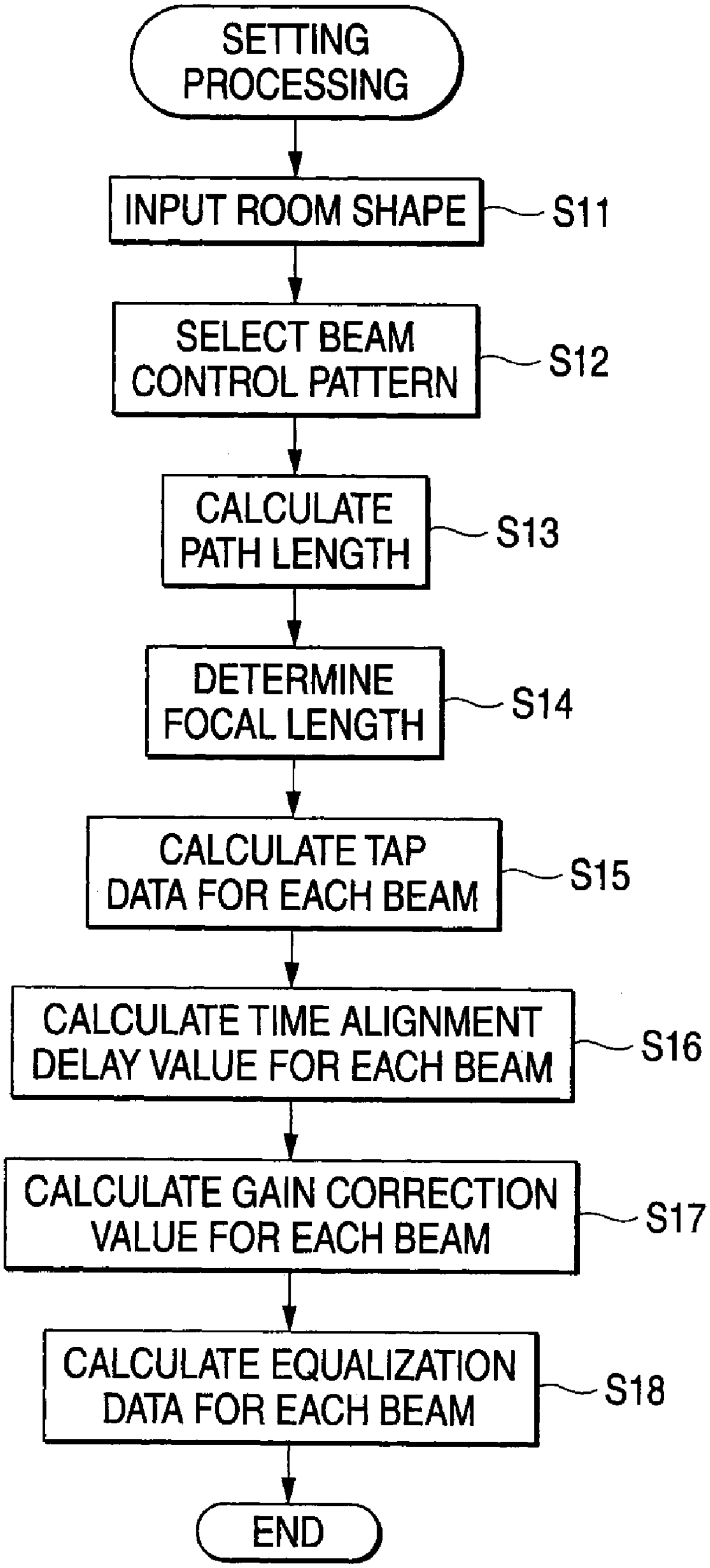
FIG. 8 A flow chart showing a procedure to operate beam control data.

FIG. 8 is a flow chart showing the procedure for operating beam control data based on a room shape. First, inputs about the width and depth of the room, the coordinates of the speaker, the coordinates of the listening position, the existence of walls, the hardness of the walls, the existence of curtains, main furniture, etc. are accepted as information for specifying the room shape (s11).

Based on the input information for specifying the room shape, one is selected from a plurality of beam control patterns shown in FIG. 1 (s12), and the path length and the focal direction of each beam are calculated (s13). Based on the calculated path length, the focal length is determined to provide a proper beam width in the listening position (s14). In this event, it is taken into consideration that the beam width increases at a longer distance, and the beam shape is narrowed as the focal length is longer. Next, based on the coordinates of each speaker unit of the array speaker 1 and the coordinates of the focal point of each beam, "tap data for each beam" to be set in the directivity control portion 23 are calculated (s15). Next, a delay value D for compensating the difference in path length of each beam to thereby establish time alignment is calculated (s16). This delay value is set in a delay portion D of the adjustment portion 22.

Next, a gain correction value G for compensating the difference in attenuation caused by the difference in path length of each beam and the difference in attenuation caused by reflection (attenuation caused by the number of times of reflection and the material of walls (including the existence of curtains) is calculated (s17). The gain correction value G is set in a gain coefficient multiplier of the adjustment portion 22. Further, equalization data for compensating high-frequency attenuation etc. caused by frequency characteristic or reflection based on the beam angle of each beam and the directional characteristic of each unit are calculated (s18). The equalization data are set in an equalizer EQ of the adjustment portion 22.

This operating procedure can be used both in the case where beam control data are calculated and stored in the pattern memory 11 in advance and in the case where beam control data are calculated extemporarily based on the input room shape data.

The beam control pattern setting operation and the beam control data operating procedure of the control portion are not limited to the aforementioned operations in the flow charts of FIGS. 7 and 8. Manual equalizer settings or changes/fine-adjustment of beam paths by the user may be accepted.

Although the present invention has been illustrated and described along its specific preferred embodiment, it is obvious to those skilled in the art that various changes or modifications can be made on the present invention without departing from its spirit, scope or intention.

This application is based on Japanese Patent Application No. 2004-201064 filed on Jul. 7, 2004, the contents of which are incorporated herein by reference.

INDUSTRIAL APPLICABILITY

According to the present invention, the beam direction (beam control pattern) of each channel suitable to a room is decided based on the shape of the room, and timing control data are set in a signal processing portion so that a beam is formed in the direction. It will therefore go well only if a user inputs the shape of the room. It is possible to reproduce multi-channel audio with an array speaker without any troublesome setting operation.

The invention claimed is:

1. A method of controlling directivity of an array loudspeaker apparatus having an array speaker comprising a plurality of speaker units arranged in an array for outputting a plurality of audio signals comprising an audio signal of a center channel, an audio signal of a first front left channel, an audio signal of a second front left channel, an audio signal of a first front right channel, an audio signal of a second front right channel, an audio signal of a surround left channel, and an audio signal of a surround right channel, wherein directivity of output of each of the audio signals from the array speaker is independently controllable by supplying each audio signal to each of the speaker units at a prescribed delay time, the method comprising the steps of:

positioning the array speaker on a front side of a room having first and second side walls;

outputting the audio signal of the center channel from the array speaker toward a listening position;

outputting the audio signal of the first front left channel from the array speaker toward the listening position;

outputting the audio signal of the second front left channel from the array speaker while controlling directivity thereof so that the output of the audio signal thereof is reflected off the first side wall and reaches the listening position;

outputting the audio signal of the first front right channel from the array speaker toward the listening position;

outputting the audio signal of the second front right channel from the array speaker while controlling directivity thereof so that the output of the audio signal thereof is reflected off the second side wall and reaches the listening position;

outputting the audio signal of the surround left channel from the array speaker while controlling directivity thereof so that the output of the audio signal thereof is reflected off the first side wall and reaches the listening position; and outputting the audio signal of the surround right channel from the array speaker while controlling directivity thereof so that the output of the audio signal thereof is reflected off the second side wall and reaches the listening position.

2. A method of controlling directivity of a loudspeaker apparatus having an array speaker comprising a plurality of speaker units arranged in an array for outputting a plurality of audio signals comprising an audio signal of a center channel, an audio signal of a front left channel, an audio signal of a front right channel, an audio signal of a surround left channel, and an audio signal of a surround right channel, wherein directivity of output of each of the audio signals from the array speaker is independently controllable by supplying each audio signal to each of the speaker units at a prescribed delay time, the method comprising the steps of:

positioning the array speaker on a front side of a room having first and second side walls;

outputting only a high-frequency component of the audio signal of the center channel from the speaker units located at a center portion of the array speaker;

outputting only a high-frequency component of the audio signal of the front left channel from the speaker units located at a left portion of the array speaker;

outputting only a high-frequency component of the audio signal of the front right channel from the speaker units located at a right portion of the array speaker;

outputting the audio signal of the surround left channel to the array speaker while controlling directivity thereof so that the audio signal thereof output from the array speaker is reflected off the first side wall and reaches a listening position; and outputting audio signal of the surround right channel to the array speaker while controlling directivity thereof so that the audio signal thereof output from the array speaker is reflected off the second side wall and reaches the listening position.

3. A method of controlling directivity of a loudspeaker apparatus having an array speaker comprising a plurality of speaker units arranged in an array for outputting a plurality of audio signals comprising an audio signal of a center channel, an audio signal of a front left channel, an audio signal of a front right channel, an audio signal of a first surround channel, an audio signal of a second surround channel, and an audio signal of a third surround channel, wherein directivity of output of each of the audio signals from the array speaker is independently controllable by supplying each audio signal to each of the speaker units at a prescribed delay time, the method comprising the steps of:

positioning the array speaker in a room having first and second walls, opposite to the second wall;

outputting only a high-frequency component of the audio signal of the center channel from the speaker units located at a center portion of the array speaker;

outputting only a high-frequency component of audio signal of the front left channel from the speaker units located at a left portion of the array speaker;

outputting only a high-frequency component of the audio signal of the front right channel from the speaker units located at a right portion of the array speaker;

outputting the audio signal of the first surround channel from the array speaker while controlling directivity thereof so that the audio signal thereof output from the array speaker is reflected off the first and second walls and reaches a listening position;

outputting the audio signal of the second surround channel from the speaker units located at a side portion of the array speaker farther from the first wall; and outputting the audio signal of the third surround channel from the speaker units while controlling directivity thereof so that the audio signal thereof output from the array speaker is reflected off the first and second walls and reaches the listening position.

4. A method controlling directivity of a loudspeaker apparatus having an array speaker comprising a plurality of speaker units arranged in an array for outputting a plurality of audio signals comprising an audio signal for a center channel, an audio signal for a front left channel, an audio signal for a front right channel, an audio signal for a surround left channel, and an audio signal for a surround right channel, wherein directivity of output of each of the audio signals from the array speaker is independently controllable by supplying each audio signal to each of the speaker units at a prescribed delay time, the method comprising the steps of:

positioning the array speaker in a room having a corner formed by a first wall and a second wall arranged at a predetermined angle with the first wall, so that the array speaker is located opposite to the corner;

outputting the audio signal of the center channel from the speaker units located at a center portion of the array speaker;

outputting only a high-frequency component of the audio signal of the front left channel from the speaker units located at a left portion of the array speaker;

outputting only a high-frequency component of the audio signal of the front right channel from the speaker units located at a right portion of the array speaker;

outputting the audio signal of the surround left channel to the array speaker while controlling directivity thereof so that the audio signal thereof output from the array speaker is reflected off the first wall and reaches a listening position; and outputting the audio signal of the surround right channel to the array speaker while controlling directivity thereof so that the audio signal thereof output from the array speaker is reflected off the second wall and reaches the listening position.

5. A method of controlling directivity of a loudspeaker apparatus having an array speaker comprising a plurality of speaker units arranged in an array for outputting a plurality of audio signals comprising an audio signal of a first front left channel, an audio signal of a second front left channel, an audio signal of a first front right channel, an audio signal of a second front right channel, wherein directivity of output of each of the audio signals from the array speaker is independently controllable by supplying each audio signal to each of the speaker units at a prescribed delay time, the method comprising the steps of:

positioning the array speaker in a room having first and second side walls and a third wall disposed between the first and second side walls, so that the array speaker is located opposite to the third wall;

outputting the audio signal of the first front left channel from the array speaker toward a listening position while controlling directivity thereof;

outputting the audio signal of the second front left channel from the array speaker while controlling directivity thereof so that the audio signal thereof output from the array speaker is reflected off the first side wall and reaches the listening position;

outputting the audio signal of the first front right channel from the array speaker toward the listening position while controlling directivity thereof;

outputting the audio signal of the second front right channel from the array speaker while controlling directivity thereof so that the audio signal thereof output from the array speaker is reflected off the second side wall and reaches the listening position; and adjusting a ratio between the outputs of the audio signal of the first front left channel and the audio signal of the first front right channel and a ratio between the outputs of the audio signal of the second front left channel and the audio signal of the second front right channel to improve acoustic balance between left and right.

* * * * *